(12) United States Patent
Tadele et al.

(10) Patent No.: US 11,357,114 B2
(45) Date of Patent: Jun. 7, 2022

(54) MOUNTING AID AND METHOD FOR MOUNTING ELECTRICAL COMPONENTS ON A PRINTED CIRCUIT BOARD

(71) Applicant: BorgWarner Ludwigsburg GmbH, Ludwigsburg (DE)

(72) Inventors: Sisay Tadele, Friolzheim (DE); Helmut Hoppe, Stuttgart (DE); Alexander Dauth, Maulbronn (DE); Gerd Bräuchle, Hüffenhardt (DE)

(73) Assignee: BorgWarner Ludwigsburg GmbH, Ludwigsburg (DE)

( * ) Notice: Subject to any disclaimer, the term of this patent is extended or adjusted under 35 U.S.C. 154(b) by 279 days.

(21) Appl. No.: 15/913,094

(22) Filed: Mar. 6, 2018

(65) Prior Publication Data
US 2018/0263121 A1  Sep. 13, 2018

(30) Foreign Application Priority Data
Mar. 10, 2017 (DE) .................... 10 2017 105 134.1

(51) Int. Cl.
*H05K 3/30* (2006.01)
*H01G 9/26* (2006.01)
(Continued)

(52) U.S. Cl.
CPC .............. *H05K 3/306* (2013.01); *H01G 2/06* (2013.01); *H01G 2/106* (2013.01); *H01G 9/06* (2013.01); *H01G 9/26* (2013.01); *H05K 3/301* (2013.01); *H05K 3/3447* (2013.01); *H01G 9/08* (2013.01); *H05K 1/18* (2013.01); *H05K 2201/09027* (2013.01); *H05K 2201/1003* (2013.01); *H05K 2201/10015* (2013.01); *H05K 2201/10265* (2013.01); *H05K 2201/10272* (2013.01); *H05K 2201/10522* (2013.01);
(Continued)

(58) Field of Classification Search
CPC ............ H05K 3/306; H05K 3/32; H01G 2/06; H01G 2/106; H01G 9/06
See application file for complete search history.

(56) References Cited

U.S. PATENT DOCUMENTS 5,192,230 A * 3/1993 Gabany .................. H01R 24/50
                                                      333/260
5,735,698 A * 4/1998 Bakker .................. H05K 3/325
                                                      439/66

(Continued)

FOREIGN PATENT DOCUMENTS

CN       102598171 A    7/2012
CN       104335689 A    2/2015

*Primary Examiner* — Jeffrey T Carley
(74) *Attorney, Agent, or Firm* — Bose McKinney & Evans LLP

(57) ABSTRACT

What is described is a mounting aid for mounting electrical components, in particular electrolytic capacitors or chokes, on a printed circuit board, said mounting aid comprising a body, which has compartments for receiving the electrical components, wherein the compartments have a base with openings for the insertion of connection wires of the electrical components, and metal parts fastened to the body, which metal parts each form at least one contact pin on the underside of the body and each from a busbar for connection to electrical components in a plurality of compartments of the body.

6 Claims, 3 Drawing Sheets

(51) Int. Cl.
  *H05K 3/34*   (2006.01)
  *H01G 9/06*   (2006.01)
  *H01G 2/06*   (2006.01)
  *H01G 2/10*   (2006.01)
  *H05K 1/18*   (2006.01)
  *H01G 9/08*   (2006.01)

(52) U.S. Cl.
  CPC .............. *H05K 2201/10606* (2013.01); *H05K 2201/10628* (2013.01); *H05K 2201/10651* (2013.01); *H05K 2201/10901* (2013.01); *H05K 2201/2018* (2013.01); *H05K 2201/2045* (2013.01)

(56) References Cited

U.S. PATENT DOCUMENTS

| | | | | |
|---|---|---|---|---|
| 5,847,938 | A * | 12/1998 | Gammon | H05K 9/003 |
| | | | | 361/816 |
| 7,532,484 | B1 | 5/2009 | Sailor et al. | |
| 8,553,429 | B2 * | 10/2013 | McNamara | H05K 7/12 |
| | | | | 361/801 |
| 9,829,162 | B2 * | 11/2017 | Han | F21S 4/10 |
| 2009/0257199 | A1 * | 10/2009 | Henderson | H01G 9/08 |
| | | | | 361/728 |
| 2010/0267252 | A1 * | 10/2010 | Fujimoto | H01G 9/012 |
| | | | | 439/55 |
| 2012/0077356 | A1 * | 3/2012 | Shimizu | H01G 9/008 |
| | | | | 439/55 |
| 2012/0081835 | A1 * | 4/2012 | Shimizu | H01G 2/06 |
| | | | | 361/306.1 |
| 2014/0321090 | A1 | 10/2014 | Guerin et al. | |
| 2014/0328008 | A1 | 11/2014 | Honda et al. | |
| 2016/0276998 | A1 * | 9/2016 | Hsieh | H01R 12/58 |

\* cited by examiner

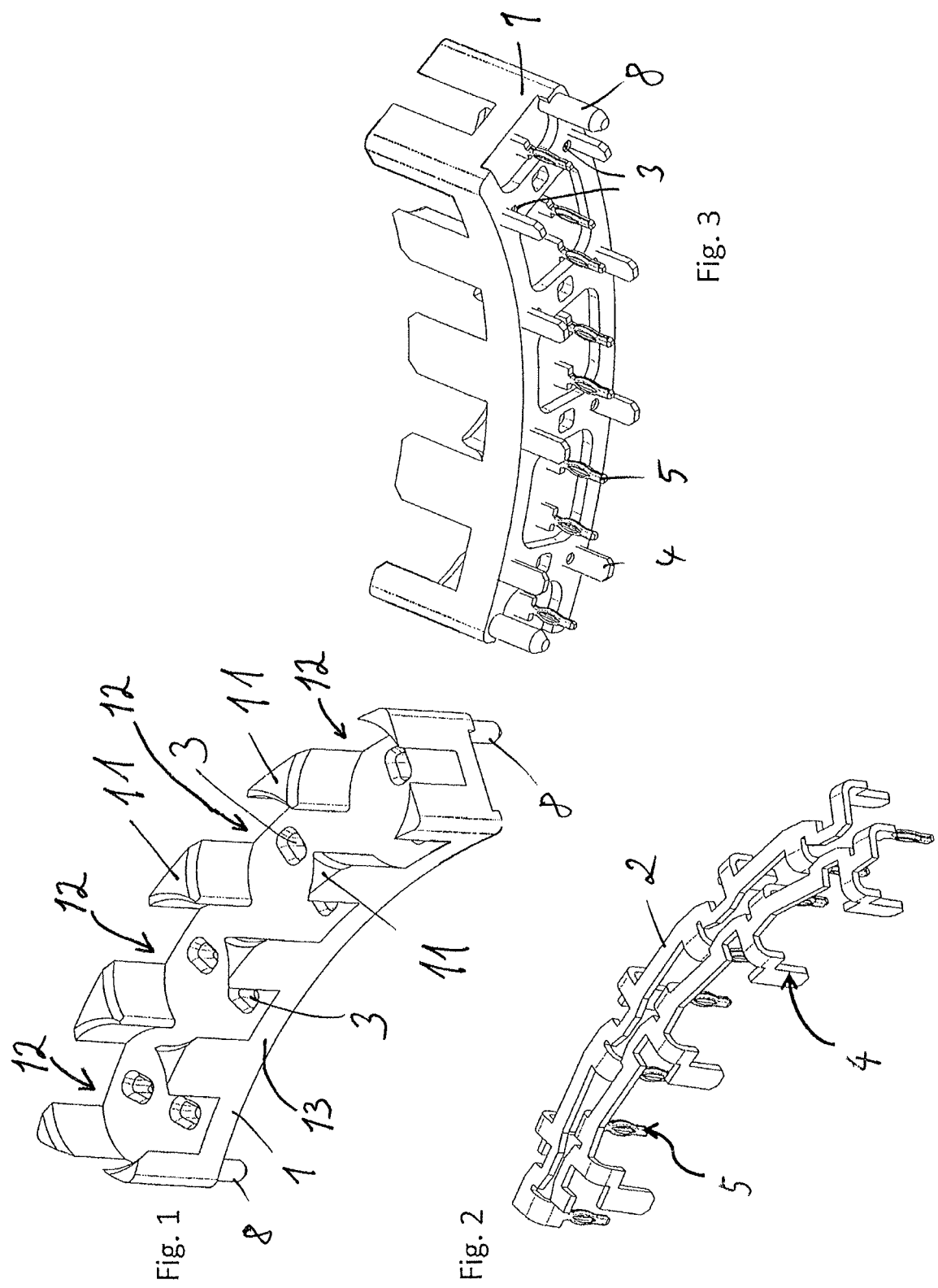

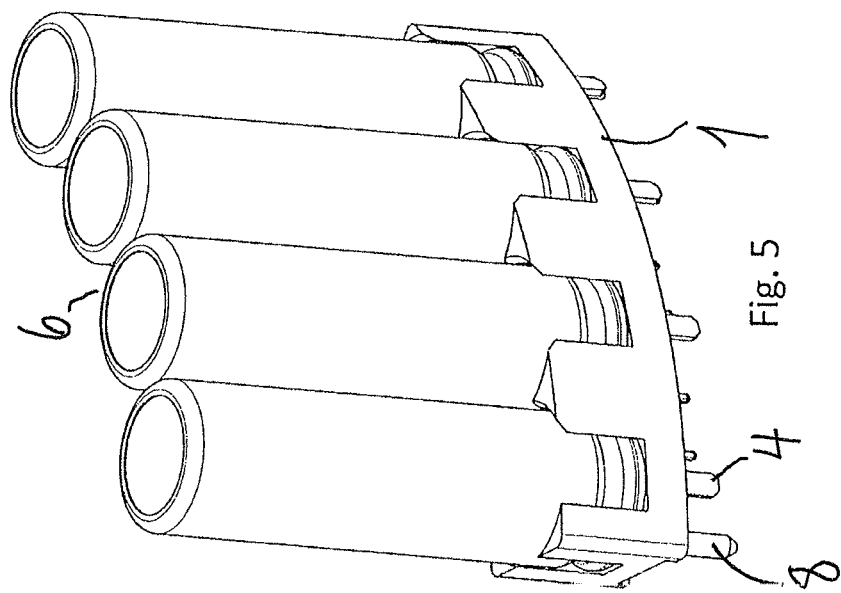
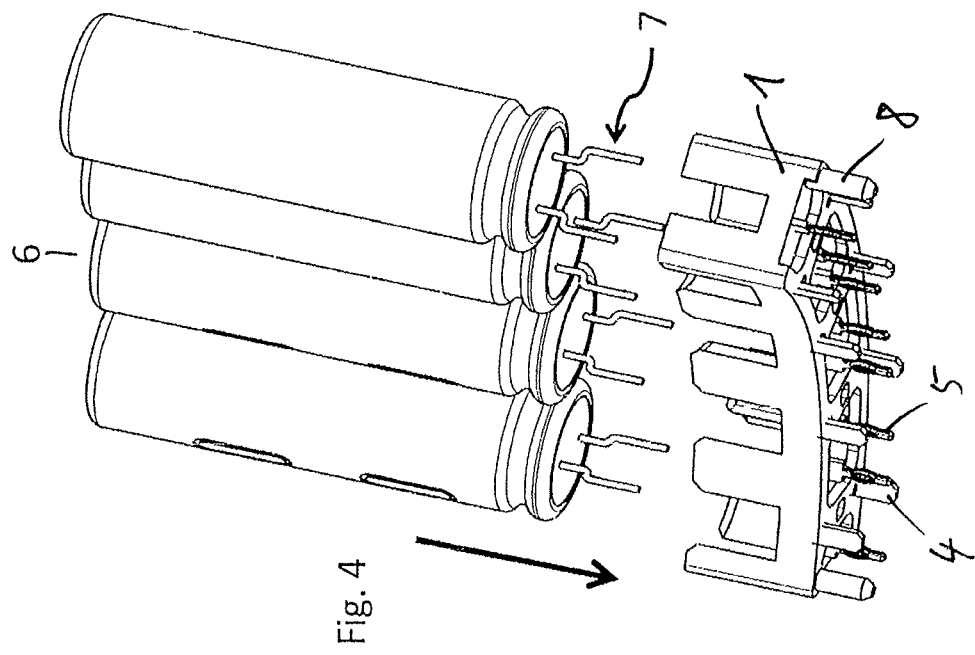

MOUNTING AID AND METHOD FOR MOUNTING ELECTRICAL COMPONENTS ON A PRINTED CIRCUIT BOARD

RELATED APPLICATIONS

This application claims priority to DE 10 2017 105 134.1, filed Mar. 10, 2017, the entire disclosure of which is hereby incorporated herein by reference.

BACKGROUND

This disclosure relates to the mounting of electrical components on a printed circuit board.

Electrical components that have connection wires, for example electrolytic capacitors or chokes, are generally mounted by means of through-hole technology (THT). Here, the connection wires are inserted into contacting holes of the printed circuit board and are individually soldered by means of a selective soldering technique. If a plurality of components of this kind has to be mounted on a printed circuit board, this results in long cycle times, a process window that is sensitive due to a relatively large amount of process parameters, complex mounting steps, and the need for meticulous facility maintenance as well as detailed quality control.

Moreover, the connections of heavy and large components, such as electrolytic capacitors and chokes, are exposed to strong mechanical loads in the event of vibrations and shocks, which can lead to premature failure. Mechanical loads of this kind are encountered for example in the case of printed circuit boards used in vehicles.

A mounting aid having a two-part polymer housing is known for mounting an electrolytic capacitor on a printed circuit board. The electrolytic capacitor is inserted into the first housing part, onto which the second housing part is then fitted and latched thereto. The first housing part carries contact pins for insertion into contact bores of the printed circuit board. The connection wires of the electrolytic capacitor are guided through openings in a side wall and are connected to the contact pins by means of an insulation displacement connection, said contact pins being oriented perpendicularly to the longitudinal direction of the electrolytic capacitor.

SUMMARY

This disclosure teaches how the mounting of large electrical components that have connection wires, in particular electrolytic capacitors or chokes, can be performed on a printed circuit board with little effort.

In accordance with this disclosure, a mounting aid is used to mount electronic components on a printed circuit board, which mounting aid has a polymer body, i.e., a body made of plastic, and at least two metal parts. The polymer forms a holder for the electrical components to be mounted and to this end has compartments for receiving the electrical components. The metal parts form connection elements that are intended for the electrical contacting of connection wires of the electrical components, e.g., contact pins for insertion into contacting holes of the printed circuit board and busbars for a plurality of electrical components. The contact pins are arranged on the underside of the polymer body, so that the mounting aid can be mounted, together with components inserted into its compartments, on a printed circuit board by insertion of the contact pins.

The metal parts can be embedded in the polymer body, for example by producing the polymer body by overmoulding the metal parts. Another possibility is to fasten the metal parts to the underside of the polymer body, for example by gluing.

A mounting aid according to this disclosure is mounted, together with the electrical components held thereon, on a printed circuit board in that contact pins of the mounting aid are inserted into contacting holes of the printed circuit board. Here, the insertion direction of the contact pins coincides with the direction in which the components are inserted into the compartments. The compartments are open on their side opposite the base.

The contact pins of the mounting aid can be formed advantageously as press-in contacts. The electrical contacting of connection wires of the electrical components and of the contact pins can be performed prior to the mounting of the mounting aid on the printed circuit board, for example in that the connection wires are soldered or welded to metal connection elements of the mounting aid.

A mounting aid according to this disclosure not only facilitates the mounting of electrical components on the printed circuit board, but also improves the mechanical reliability of the electrical contacting. The mounting aid as a holder of the electrical components can significantly reduce the effects of vibrations or shocks on the contacting. In particular, mechanically unreliable soldered connections of connection wires to contacting holes or other metal surfaces of the printed circuit board are avoided.

An advantageous refinement of this disclosure provides that the compartments of the mounting aid have a base with openings for insertion of the connection wires of the electrical components. The connection elements are preferably free at the underside of the polymer body. Since the connection wires are inserted through the openings in the base of the compartments and are then bent, they can contact the connection elements on the underside of the polymer body well, for example can be soldered or welded to the connection elements. Here, the connection elements can be formed as a planar portion of a metal part or the contacting can be facilitated by a specific shaping. For example, the connection elements may form a groove or a sleeve, in which a bent wire portion is received. The connection elements can extend along the underside of the polymer body or perpendicularly thereto so as to be inserted into openings of the printed circuit board.

The polymer body can have grooves on its underside so as to receive the bent portions of the connection wires. If the connection wires of the electronic components are inserted through the openings in the base of the compartments, grooves on the underside of the polymer body facilitate the correct positioning of the connection wires for a contacting of the metal connection elements.

A further advantageous refinement of this disclosure provides that the mounting aid, in addition to the contact pins, which are provided for the electrical contacting of the printed circuit board, also comprises fastening pins or pegs, which are inserted suitably into matching openings of the printed circuit board so as to strengthen the mechanical connection between the printed circuit board and the mounting aid or facilitate the correct positioning of the mounting aid relative to the printed circuit board. In particular in the case of heavy and bulky components, such as chokes or electrolytic capacitors, the effects of vibrations or shocks, which for example occur in vehicles, on the electrical contacting can thus be reduced. Fastening pins or pegs can be formed by the polymer body or by parts fastened thereto.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein:

FIG. 1 shows an embodiment of a mounting aid for mounting electrical components on a printed circuit board;

FIG. 2 shows an embodiment of the metal parts of the mounting aid;

FIG. 3 shows a further view of the mounting aid shown in FIG. 1;

FIG. 4 shows the mounting aid together with a plurality of electrical components;

FIG. 5 shows the mounting aid with inserted electrical components;

DESCRIPTION

The embodiments described below are not intended to be exhaustive or to limit the invention to the precise forms disclosed in the following detailed description. Rather, the embodiments are chosen and described so that others skilled in the art may appreciate and understand the principles and practices of this disclosure.

Figure 6:
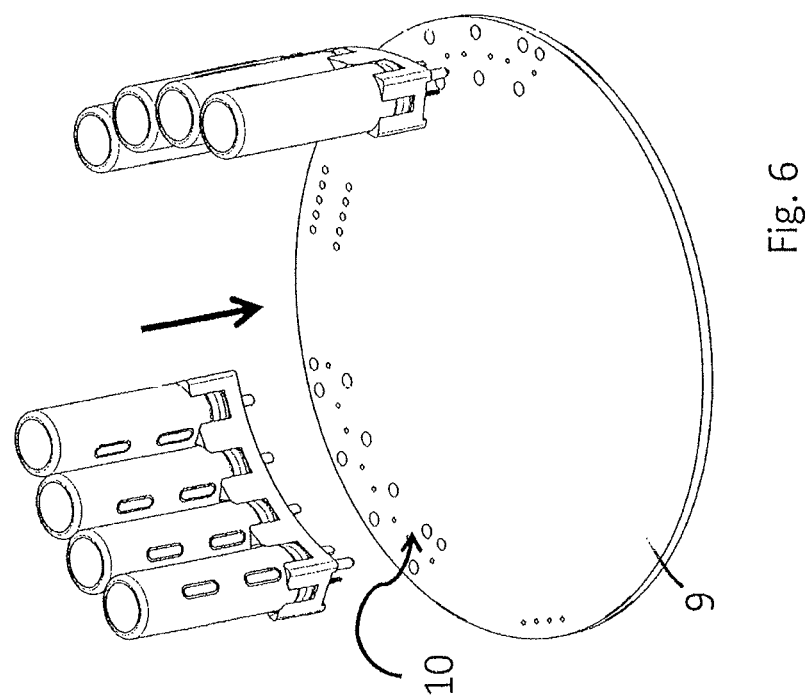
FIG. 6 shows a plurality of mounting aids with inserted components and an example of a printed circuit board.

The mounting aid shown in FIGS. 1 and 3 has a polymer body 1 and the metal parts 2 shown in FIG. 2. The polymer body 1 forms a holder for electrical components 6 and to this end has compartments 12 on its upper side for the electrical components 6, for example electrolytic capacitors, which in FIGS. 5 and 6 are shown together with the mounting aid.

Openings 3 for connection wires 7 of the electrical components 6 are formed in the base 13. Once the components 6 have been inserted into the compartments of the body 1, the connection wires 7 of the components 6 are electrically connected to the metal parts 2, for example by soldering or welding. The metal parts 2 each form a busbar for the components 6 inserted into the compartments.

The metal parts 2 can be embedded in the polymer body 1, for example by overmoulding, or can be fastened to the underside of said polymer body, for example by gluing. The metal parts 2, at the underside of the polymer body 1, form contact pins 5, which for example can be formed as press-in contacts, i.e., have a bulging middle part, which presses against the printed circuit board, more specifically the edge of the openings. The contact pins 5 are oriented here so that the direction in which the components 6 are inserted into the compartments of the polymer body 1 coincides with the insertion direction of the contact pins 5 into contact openings of the printed circuit board. The polymer body 1 thus does not have a cover or top above the base, and instead has just base and side walls that define the compartments 12.

Figure 7:
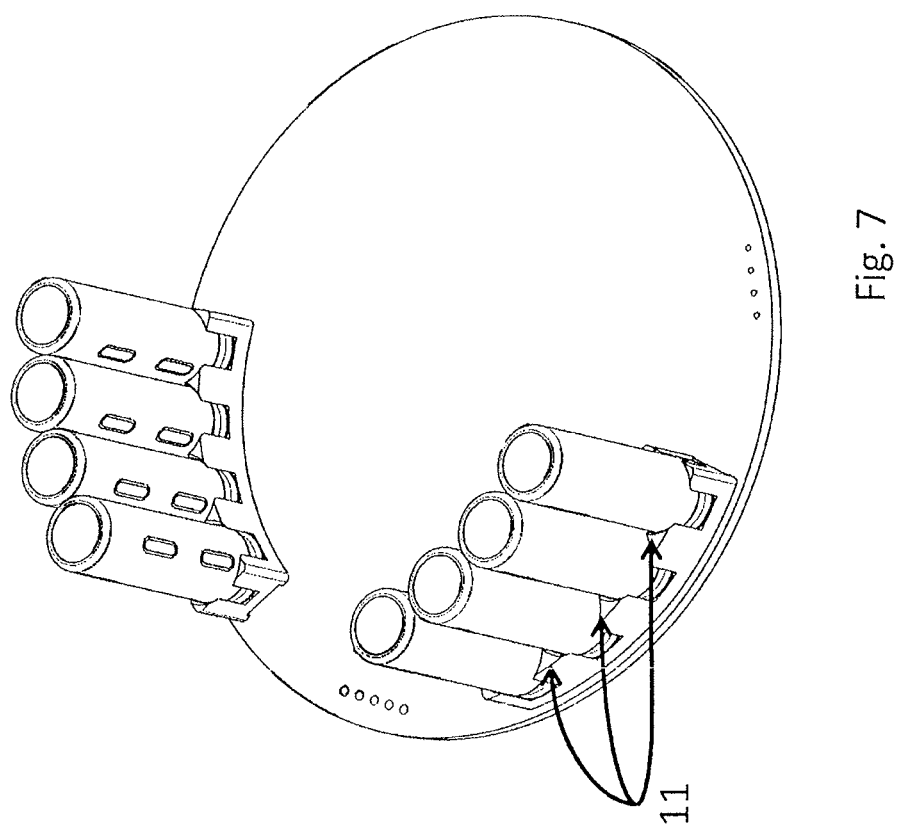
FIG. 7 shows the printed circuit board with mounting aids mounted thereon and electrical components.

In order to contact the connection wires 7, the metal parts 2 have connection elements 4, which are planar in the embodiment shown. The connection wires 7 for example can be welded or soldered to the connection elements 4. The connection elements 4 can extend along the underside of the polymer body 1, so that the connection wires 7 have to be bent after they have been inserted through the openings 3 in the base of the compartments. Another possibility lies in the fact that the connection elements 4 extend parallel to the contact pins 5 and are also inserted into openings of the printed circuit board 9, as is shown in FIGS. 6 and 7.

As is shown in particular in FIG. 3, the polymer body 1 has pegs 8 on its underside, which are inserted into matching openings of the printed circuit board 9. The pegs 8 can be tapered at their free end portion, for example conically, in order to facilitate the insertion into openings of the printed circuit board 9. The pegs facilitate the correct positioning of the mounting aid on the printed circuit board 9 and thus the insertion of the contact pins 5. In addition, the pegs 8 can strengthen the mechanical connection of the mounting aid to the printed circuit board 9.

In order to insert the mounting aid with its contact pins 5 and the pegs 8 into corresponding holes 10 of the printed circuit board 9, a press-in force is necessary, which is applied by a press-in tool. The press-in force is introduced into the mounting aid by the press-in tool via press-in faces 11 of the polymer body 1. The press-in faces 11 are arranged between the individual compartments and can be planar.

The mounting aid facilitates the mounting of electrical components 6 such as electrolytic capacitors or chokes. The mounting aid advantageously forms a holder for the electrical components 6 and thus relieves the electrical connections of the components 6 to the printed circuit board in the event of vibrations or shocks, as occur with use of the printed circuit board 9 in apparatuses belonging to a vehicle. In addition, the mounting aid can also thermally decouple the components 6 from the printed circuit board 9.

While exemplary embodiments have been disclosed hereinabove, the present invention is not limited to the disclosed embodiments. Instead, this application is intended to cover any variations, uses, or adaptations of this disclosure using its general principles. Further, this application is intended to cover such departures from the present disclosure as come within known or customary practice in the art to which this invention pertains and which fall within the limits of the appended claims.

LIST OF REFERENCE SIGNS 1 polymer body
2 metal part
3 opening
4 connection element
5 contact pin
6 electrical component
7 connection wires
8 pegs
9 printed circuit board
10 holes
11 press-in faces
12 compartments

What is claimed is:

1. A mounting aid for mounting electrical components on a printed circuit board, the mounting aid comprising:
  a body defining a base with openings for the insertion of connection wires of the electrical components;
  compartments extending from an upper side of the base for receiving the electrical components;
  metal parts fastened to the body, the metal parts forming a plurality of contact pins and connection elements extending from under the body, wherein the contact pins and connection elements are shaped differently and are both configured for insertion into the circuit board, further wherein the contact pins have a bulging section configured for pressing against the inside of first openings formed in the circuit board; and the body having pegs formed of a polymer configured for insertion into second openings of the printed circuit board.

2. The mounting aid according to claim 1, wherein the compartments are open on a side opposite the base, whereby the compartments guide the components during insertion into the compartments in a direction that coincides with an insertion direction of the contact pins.

3. The mounting aid according to claim 1, wherein the connection elements are exposed and contacted at an underside of the body by connection wires.

4. The mounting aid according to claim 3, wherein the body has grooves on the underside in order to receive bent portions of the connection wires.

5. The mounting aid according to claim 1, wherein the contact pins are configured for a press-fit connection to the circuit board.

6. The mounting aid according to claim 5, wherein the connection elements comprise flat contacts for insertion into third openings of the printed circuit board.

\* \* \* \* \*

UNITED STATES PATENT AND TRADEMARK OFFICE
CERTIFICATE OF CORRECTION

| | |
|---|---|
| PATENT NO. | : 11,357,114 B2 |
| APPLICATION NO. | : 15/913094 |
| DATED | : June 7, 2022 |
| INVENTOR(S) | : Sisay Tadele et al. |

It is certified that error appears in the above-identified patent and that said Letters Patent is hereby corrected as shown below:

On the Title Page

Item (57) Abstract, the phrase "each from a busbar" should read --each form a busbar--.

Signed and Sealed this
Twentieth Day of September, 2022

*Katherine Kelly Vidal*

Katherine Kelly Vidal
*Director of the United States Patent and Trademark Office*